United States Patent
Roedle et al.

(10) Patent No.: US 8,357,979 B2
(45) Date of Patent: Jan. 22, 2013

(54) ELECTRONIC DEVICE COMPRISING A FIELD EFFECT TRANSISTOR FOR HIGH-FREQUENCY APPLICATIONS

(75) Inventors: Thomas Christian Roedle, Nijmegen (NL); Hendrikus Ferdinand Franciscus Jos, Nijmgen (NL); Stephan Jo Cecile Henri Theeuwen, Nijmgen (NL); Petra Christina Anna Hammes, Nijmegen (NL); Radjindrepersad Gajadharsing, Nijmegen (NL)

(73) Assignee: NXP B.V., Eindhoven (NL)

( * ) Notice: Subject to any disclaimer, the term of this patent is extended or adjusted under 35 U.S.C. 154(b) by 1874 days.

(21) Appl. No.: 10/555,054

(22) PCT Filed: Apr. 28, 2004

(86) PCT No.: PCT/IB2004/050543
§ 371 (c)(1), (2), (4) Date: Oct. 28, 2005

(87) PCT Pub. No.: WO2004/097941
PCT Pub. Date: Nov. 11, 2004

(65) Prior Publication Data
US 2006/0231905 A1    Oct. 19, 2006

(30) Foreign Application Priority Data
May 2, 2003 (EP) .................................... 03101224

(51) Int. Cl.
*H01L 29/94* (2006.01)

(52) U.S. Cl. ................. 257/392; 257/E29.053
(58) Field of Classification Search .................. 257/392, 257/262, 401, E29.053
See application file for complete search history.

(56) References Cited

U.S. PATENT DOCUMENTS

| 4,843,358 A | 6/1989 | Meise et al. |
|---|---|---|
| 5,747,854 A | 5/1998 | Gotou |
| 6,020,617 A * | 2/2000 | Jos ................................ 257/401 |
| 2002/0047140 A1 * | 4/2002 | Moller et al. .................. 257/262 |

FOREIGN PATENT DOCUMENTS

| JP | 59-155966 A | 9/1984 |
|---|---|---|
| JP | 10-335642 | 12/1998 |
| JP | 2003-092402 A | 3/2003 |
| WO | WO 02/07223 A1 | 1/2002 |

OTHER PUBLICATIONS

Van Der Heijden et al.; "Theory and Design of an ultra-linear Square-Law Approximated LDMOS power amplifier in class-AB operation", IEEE Transactions on Microwave theory and techniques, vol. 50, No. 9; p. 2176-2184; Sep. 2002.

* cited by examiner

*Primary Examiner* — Victor A Mandala
*Assistant Examiner* — Selim Ahmed

(57) ABSTRACT

An electronic device comprising a field-effect transistor having an inter digitated structure suitable for high-frequency power applications, and having multiple threshold voltages that are provided in different regions of each a segment of the interdigitated structure. This leads to a dramatic improvement in linearity over a large power range in the back-off region under class AB signal operation.

10 Claims, 5 Drawing Sheets

ELECTRONIC DEVICE COMPRISING A FIELD EFFECT TRANSISTOR FOR HIGH-FREQUENCY APPLICATIONS

The invention relates to an electronic device comprising a field effect transistor provided with a plurality of parallel-connected transistor segments having mutually different threshold voltages. The invention in particular relates to a field effect transistor which is suitable for use with high power levels and high frequencies.

Such a transistor is known from WO-A 02/07223. In this prior art transistor, at least one group of said transistor segments have a threshold voltage different from that of the rest of the transistor segments. Within the context of this application, the term segment is understood to mean a part of a transistor having finger-shaped gate electrodes, each finger being a segment. The linearity and the efficiency are improved by varying the threshold voltage. In particular, an LDMOS-type transistor was provided in which one half of the transistor had a threshold voltage different from that of the other half. The difference between the two threshold voltages was approximately 0.3 V. As a result, the intermodulation distortion was improved by approximately 3 dB when the transistor was operated at a frequency of 1.8-2.0 GHz and an output power level of 17 dB. The intermodulation distortion is a measure of the linearity. In a very simple LDMOS model, only the main source of distortion is taken into account, namely the non-linearity in the transfer characteristic (the Ids-Vgs characteristic). The distortion is built up of a number of terms in that case, which are the higher derivatives of the transconductance. A more detailed explanation of the intermodulation distortion concept is known inter alia from Van der Heijden et al. IEEE Transactions on Microwave Theory and Techniques, Vol. 50, No. 9, September 2002, pp 2176-2184.

During experiments that led to the invention it was found that the fact that a first group of segments have a threshold voltage different from that of a second group of segments in itself does not suffice for achieving an improved linearity whilst retaining or improving the efficiency level. In particular it was found that an LDMOS transistor comprising a first, a second and a third group of segments, each having their own threshold voltage, does not exhibit any relevant improvement as regards the linearity or the efficiency at all. In these experiments, the differences between the threshold voltages in the various segments generally varied between 0.1 V and 1.5 V in comparison with a non-distributed device.

For this reason it is an object of the invention to provide a transistor of the kind referred to in the introduction, in which a linearity improvement in the back-off region is realized whilst retaining or improving the efficiency level, and in which the obtained device can be upscaled to higher power levels. As a result, the back-off region is characterized by the use of a power level lower than the maximum power level. As a result of the use in the back-off region, a sufficiently linear transistor behavior is retained also in the case of peak loads.

This object is achieved in that each of the transistor segments comprises a first region and a second region, the first region having a first threshold voltage and the second region having a second threshold voltage.

Surprisingly it has been found that if the intermodulation distortion in the back-off region is to be reduced whilst retaining the same efficiency level, a transistor segment needs to have different regions having different threshold voltages. This is also a condition for easy scalability of the device in question to higher power levels.

The parallel connection of the gate electrodes of the non-uniform segments has a positive effect on the gate-drain characteristics. In particular the dependence of the current on the drain ($I_d$) as a function of the voltage on the gate ($V_g$) is concerned here. As a result of this positive effect, the uneven higher terms of the intermodulation distortion are minimized in the gate voltage range that is relevant to the desired application. This leads to a significant improvement in the inter-modulation behavior in back-off as a result of the linearization of the amplitude transfer characteristics (AM-AM conversion). Not only the third order intermodulation is concerned, but also the fifth order and seventh order intermodulation. It has been found that the AM-AM conversion is influenced in particular by the selected differences in the threshold voltage between the various regions within a segment.

It has been found that an improved linearity can already be observed when two regions per segment are used. Preferably, a segment comprises three to five regions, more preferably three regions. The drawback of using more than five regions is that he manufacturing costs will strongly increase.

An advantageous aspect of the transistor according to the invention is the fact that its design is scalable. After all, the core element is a single segment, and its functioning appears not to be dependent on the presence of specific neighboring segments. It is possible, therefore, to add a number of segments in the design, for example in order to be able to handle higher power levels. Preferably, at least 20 segments are present, preferably 40-100, so as to enable output power levels of more than 5 W, in particular more than 30 W.

In particular, the scalability is much better than the scalability of a transistor having at least three threshold voltages, in which the threshold voltage varies among the segments (i.e. a first, a second and a third group of segments). For the optimization of the characteristics it is necessary for the groups to have different surface areas. Upon variation of the threshold voltage among the segments, this implies a different number of segments per group. Upscaling to higher output power levels without any loss of quality can only be realized under specific circumstances with transistors of that type; that is, when the upscaling factor is such that it results in a whole number of segments for each group again. In the case of an upscaling factor of, for example, 1.15 or 1.33, there is very little chance of achieving this. In the device according to the invention, however, transistor segments may be added as desired.

In order to realize a further improvement, it is necessary to linearize the phase transfer characteristic (AM-PM conversion). This characteristic appears to be strongly influenced by the manner in which the various segments are connected and by the manner in which the total width of the gate electrode is distributed over the regions that are present. It is in particular advantageous for the threshold voltages to vary between 10 and 40%, preferably between 20 and 30% of the average threshold voltage. Within the context of the present application, the variation of the threshold voltage is understood to mean the difference between the lowest and the highest threshold voltage present.

Furthermore it is advantageous if the region having the highest threshold voltage also comprises the largest surface area. In a segment comprising three regions, the area of the first region having the highest threshold voltage comprises 30 to 70%, the area of the third region having the lowest threshold voltage comprises 20 to 50%, and the area of the second region comprises 10 to 30%.

Various techniques may be used for generating the difference in threshold voltage, as is known per se. Examples of such techniques are: variation of the thickness of the gate dielectric, in particular the gate oxide, variation of the doping concentration in the channel, and variation of the material of the gate electrode and the gate dielectric.

The field effect transistor according to the invention is, for example, a transistor of the laterally diffused metal-oxide semiconductor (LDMOS) type based on a Si or SiC semiconductor substrate. Otherwise, the inventive concept may be realized in transistors formed in so-termed III-V material, such as GaN, GaAs, InP, and in various transistor types, such as MESFET—in particular HEMT and inverted HEMT, JFET, MODFET and MISFET transistors. The transistor is very suitable for use at high frequencies, for example in the range from 0.9 to 3 GHz, and at higher supply voltages, for example in the order of 20 to 30 V. Furthermore, one or more transistor segments may be provided with an additional gate electrode, which are connected to one or more contacts. It has been found that the linearity of the device can be improved significantly with such a contact.

Preferably, the device according to the invention furthermore comprises a module substrate, on which the transistor is assembled, and an impedance matching circuit is provided for adjusting the output impedance of the transistor. Transistors according to the invention are very suitable for use as amplifiers, for example in mobile communication and optical network communication applications. As a rule, filters and circuits for regulating the impedance are used to ensure that the transistor is properly attuned to aerials or other components that are connected downstream of the transistor. In the transistor according to the invention, both the transconductance (AM-AM transfer) and the phase (AM-PM transfer) are optimized. Thus both the real and the imaginary impedance component are readily predictable, which simplifies the impedance matching process. Preferably, a heat sink is present for dissipating any excess heat. Filters and other passive components are present on or integrated in the module substrate.

The above and further aspects of the electronic device will now be explained in more detail with reference to a number of figures, in which.

The Figures are not drawn true to scale, and in particular the thickness dimensions are exaggerated for the sake of clarity. Regions corresponding to each other are indicated by the same reference numeral as much as possible.

Figure 1:
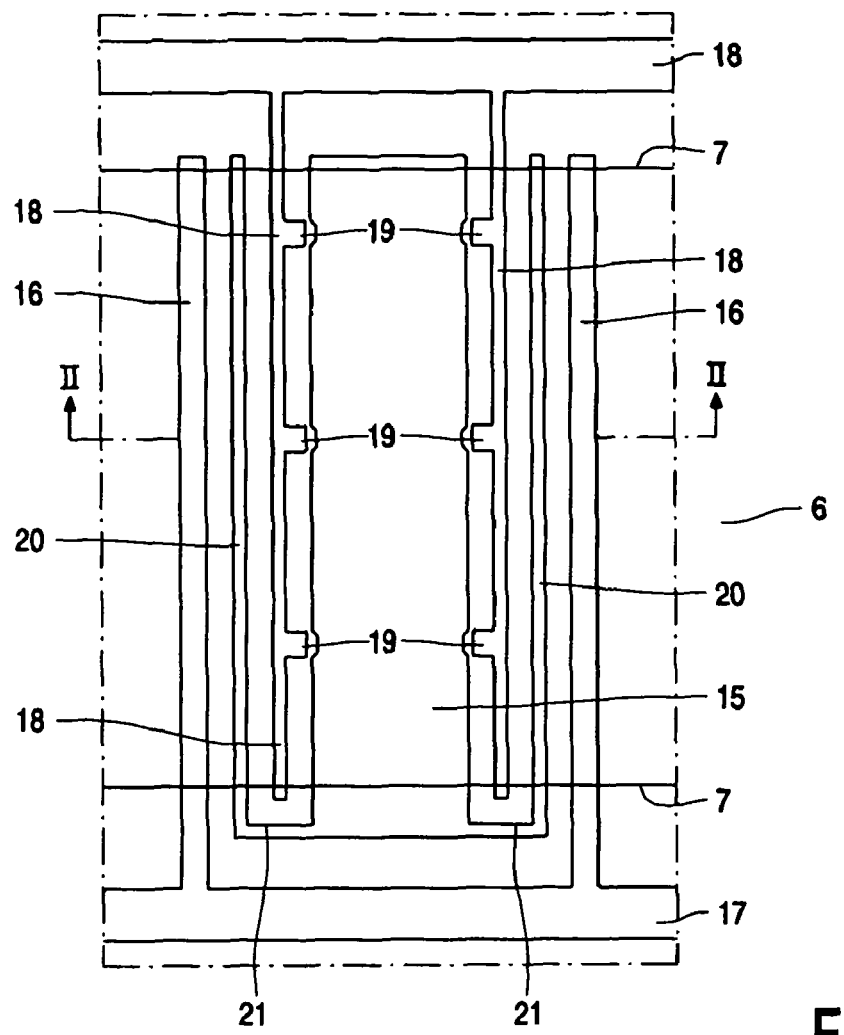
FIG. 1 is a plan view of a semiconductor device.
Figure 2:
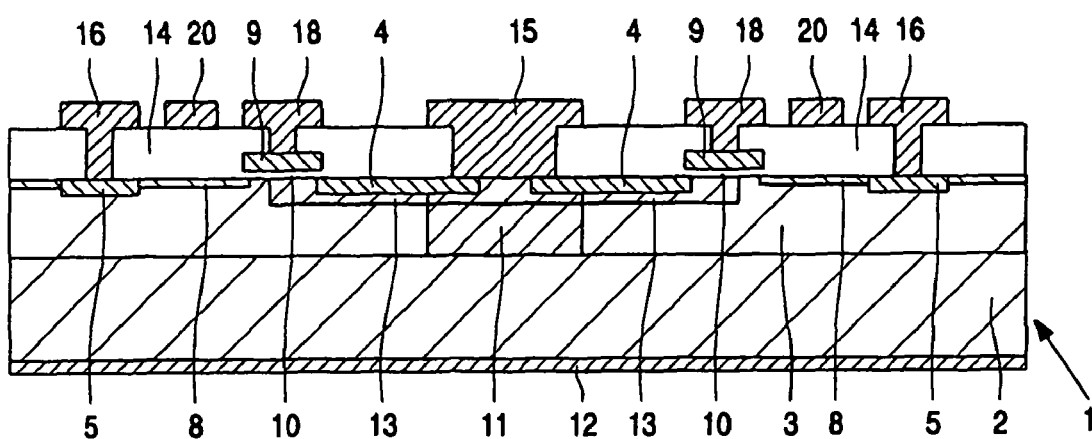
FIG. 2 is a schematic, cross-sectional view of the device that is shown in FIG. 1, along the line II-II.

FIG. 1 is a plan view of a transistor as present in the device according to the invention. FIG. 2 shows the corresponding cross-section along the line II-II in FIG. 1. The device comprises a semiconductor body 1, which is made of silicon in this example, but which may also be made of another suitable semiconductor material, of course. The semiconductor body is built up of a low-ohmic, highly doped p-type substrate 2 and a comparatively weakly doped, high-ohmic region 3 adjoining the surface of the silicon body, in which the transistor is accommodated. In this example, the region 3 is formed by a p-type epitaxial layer having a thickness of approximately 7 μm and a doping concentration of approximately $5.10^{15}$ atoms per cm$^3$. The doping concentration of the substrate 2 which functions as a connection for the source zone is high, for example between $10^{19}$ and $10^{20}$ atoms per cm$^3$. An active region 6 is defined in the epitaxial layer, which region is laterally bounded by thick field oxide 7. Source and drain zones of the transistor are provided in the active region in the form of highly doped n-type surface zones 4 and 5, respectively. The transistor comprises a segment structure comprising a number of adjacent source/drain fingers. This structure may be obtained in a simple manner, for example by extending the portion that is shown in FIG. 1 and FIG. 2 to the left and to the right until the desired channel width is obtained. To increase the breakdown voltage, the drain zone 5 is provided with a high-ohmic n-type drain extension 8 between the drain zone 5 and the channel of the transistor. The length of the extension is 3.5 μm in this example. The transistor channel is formed by the p-type region 13 between the extension 8 and the source zone 4. A gate electrode 9 is provided above the channel, which gate electrode is separated from the channel by a gate oxide 10 having a thickness of, for example, 70 nm. The gate electrode 9 is formed by strips of highly doped, approximately 0.3 μm thick polycrystalline silicon (poly) overlaid with 0.2 μm titanium silicide, which, seen at the surface, extends transversely over the active region 6 between the source zones 4 and the drain extensions 8. The source zone (or zones) 4 is (are) short-circuited with the p-type region via a deep, highly doped p-type zone II which extends from the surface down to the highly doped substrate and which connects the source zone 4 to the source electrode 12 at the underside of the substrate via the substrate 2. The transistor is embodied as an LDMOST, so that it can be operated at a sufficiently high voltage, for which purpose an additional p-type doping is provided in the channel in the form of the diffused p-type zone 13, so that the doping concentration is locally increased as compared with the weak epi doping.

The surface is coated with a thick glass layer, in which contact windows are provided above the source and drain zones, through which contact windows the source and drain zones are connected to metallic source and drain electrodes 15 and 16, respectively. Said electrodes 15 and 16 are formed by metal strips extending parallel to each other over the glass layer. The source contact 15 is not only connected to the source zone(s), but also to the deep p-type zone 11, and thus interconnects the source zone and the connection 12 at the underside of the substrate. The source zone may be connected to external connections or circuit elements via this connection. The drain electrodes 16 together with the base portion forms a comb structure and they may be connected to a number of bond pads present elsewhere on the crystal via the common portion 17.

The gate electrode 9 of the device is also provided with a metal contact, which extends in the form of a strip 18 over the oxide layer between the metal strips 15 and 16, and which is locally connected to the gate 9 via contact windows in the oxide layer 14. The metal track 18 is not connected to the gate 9 over its entire length, but only at a number of interspaced locations 19, at which the poly gate 9 is provided with widened portions suitable for connections. If the interspacings between the connections 19 are sufficiently small, the gate resistance is significantly reduced by the presence of the metal tracks 18. The resistance of the gate electrode is also reduced by the presence of titanium silicide thereon. A very low gate resistance can be obtained through the use of a metal having a low resistivity, for example gold or aluminum. Further metal tracks 20 are provided between the metal or, in this case, metal silicide tracks 18 and the drain contact tracks, which further metal tracks form a capacitive screen between the gate 9,18 and the drain electrode 16. The screening tracks 20 are connected to the source electrode 15 beyond the peaks of the metal tracks 18 via connections 21, and to the connection of the source via said electrode.

Figure 3:
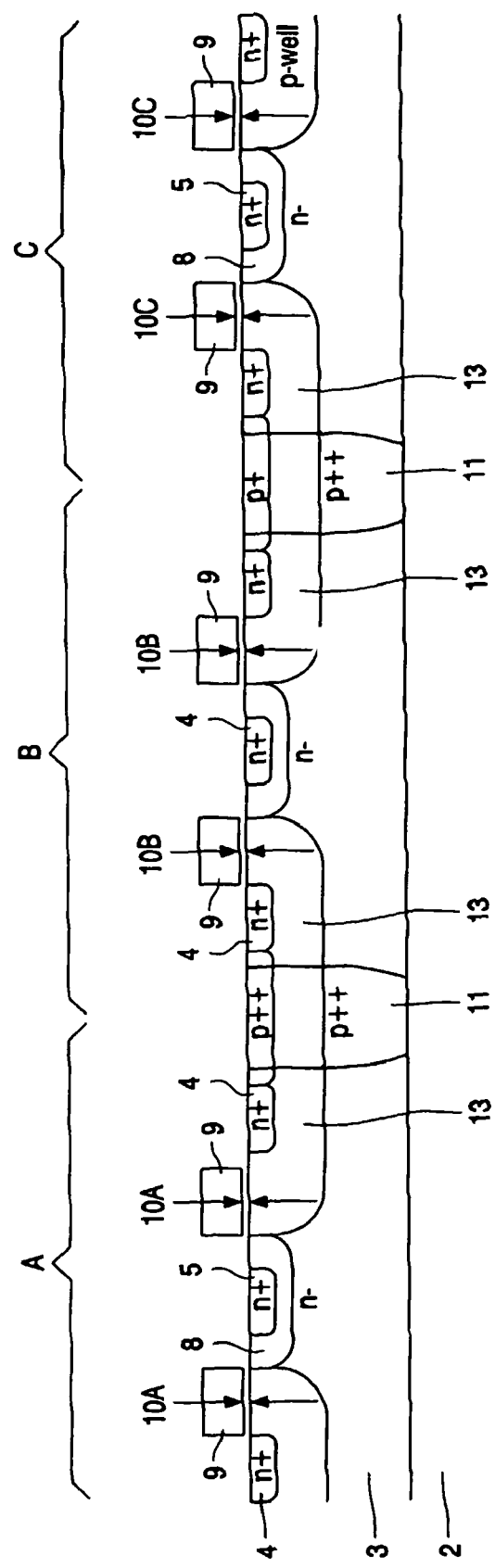
FIG. 3 is a schematic, cross-sectional view of a prior art transistor.

FIG. 3 is a further cross-sectional view of the device according to the prior art, showing a number of parallel segments A, B, C having mutually different threshold voltages. The differences in the threshold voltages have been realized in this case by varying the thickness of the gate oxide 10 (10A, 10B, 10C). The connecting contacts are not shown for reasons of simplicity of the drawing.

Figure 4:
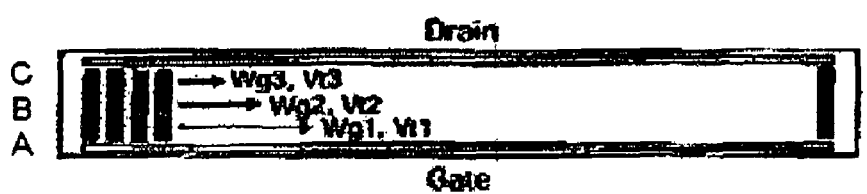
FIG. 4 is a plan view of a few segments in the transistor according to the invention.

FIG. 4 is a schematic plan view of the device according to the invention, in which a transistor 1 comprising several segments A, B, C is shown.

Figure 5:
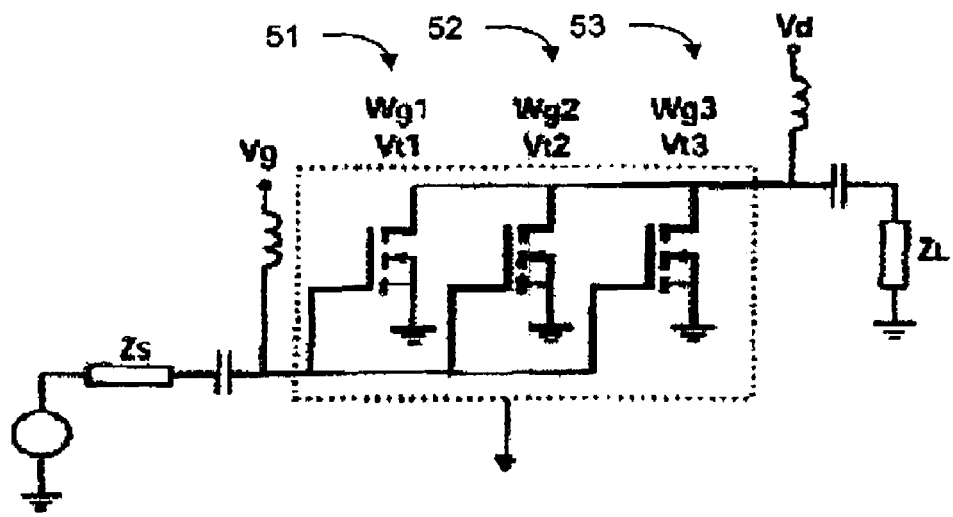
FIG. 5 shows an equivalent circuit diagram of the device that is shown in FIG. 4.

FIG. 5 shows a corresponding electric diagram. The connecting contacts for the gate electrode $V_g$ and the drain electrode $V_d$ exhibit self-inductance at frequencies of 2 GHz. The drain electrode is connected to earth via a capacitor and an impedance $Z_L$. The source electrode is connected to a contact via an impedance $Z_s$.

In the embodiment shown, all segments have the same layout, comprising a first region 51, a second region 52 and a third region 53. The basic threshold voltage is in the order of 3-3.5 V in this embodiment, with variations between the regions of 10-15%. The first region comprises a surface area of 40-50%, the second region comprises a surface area of 15-25%, and the third region comprises a surface area of 30-40%, the total being 100%. At an average power $P_0$-avg of 30 dBm, the following values are found for the intermodulation distortions: IMD3−52 dBc; IMD5−72 dBc and IMD7<−80 dBc. A 13 dB gain was obtained. The measurements took place at a frequency of 2 GHz, T=20° C., $I_{dq}$=270 mA and a load line of 46 dBm (40 W) and a source-drain voltage $V_{ds}$ of 26 (V). The same measurements were carried out with a basic threshold voltage in the order of 4.5-5.0 V and a larger gate oxide thickness, with comparable results being obtained.

By way of comparison, measurements were carried out in the above conditions on a comparable transistor having a uniform threshold voltage of 4.9 V. The following values were obtained: IMD3−46 dBc; IMD5−53 dBc and IMD7−65 dBc. A 13 dB was obtained.

Figure 6:
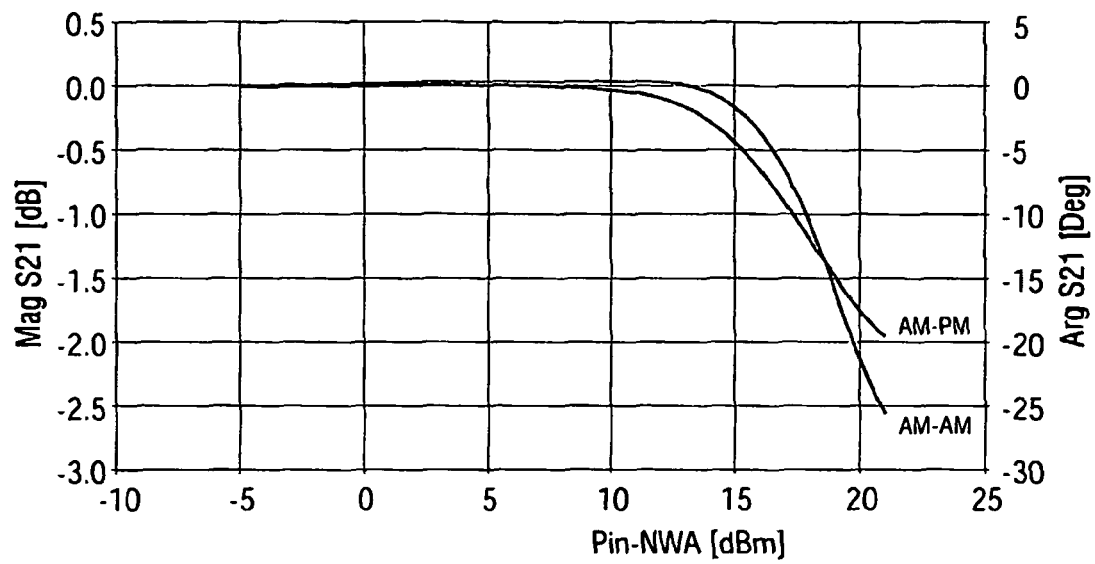
FIGS. 6-9 are graphs which show the electric characteristics of the device according to the invention and of a prior art device.
Figure 7:
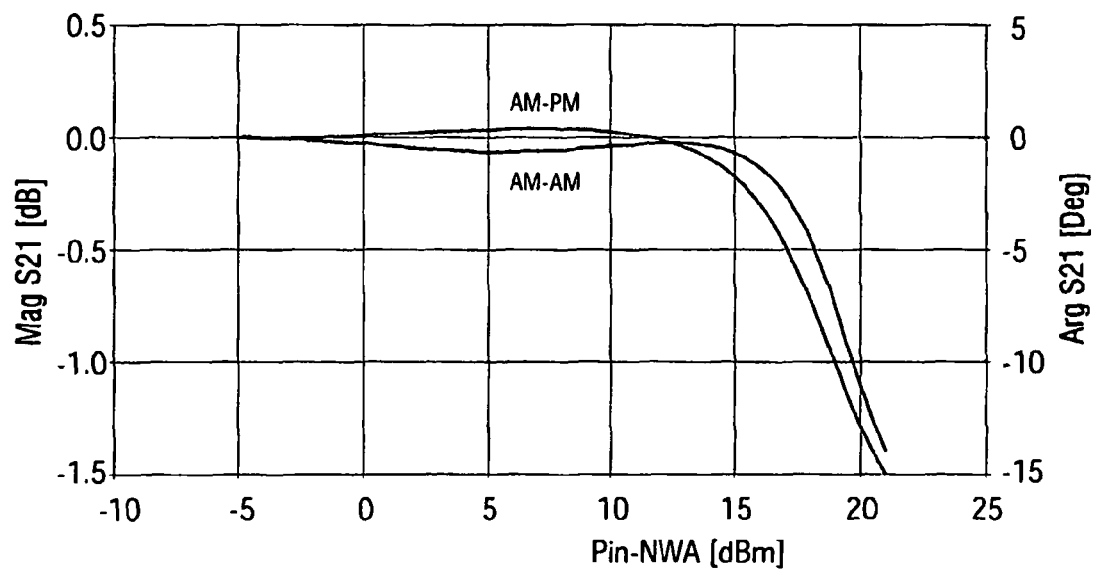

FIG. 6 shows the AM-AM conversion and the AM-PM conversion as functions of an input power for the device according to the invention. FIG. 7 shows the same data for a prior art device, in particular the transistor with the aforesaid index numbers. A linearity-characterizing complex magnitude is S21, the large signal transducer gain which is defined as the ratio between the forward wave at the output and the forward wave at the input, can be represented as r.$e^{i*\Phi}$. The magnitude of the gain Mag S21 (in dB) is plotted on one y-axis, and the normalized argument (the angle) of the gain Arg S21 (in degrees) is plotted on the other y-axis. Upon comparison it becomes apparent that the gain in the transistor according to the invention is more linear both as regards the magnitude and as regards the angle over a large range of input power levels ($P_{in}$ as determined by means of a Network Analyser (NWA)) from 6 to 15 dBm.

Figure 8:
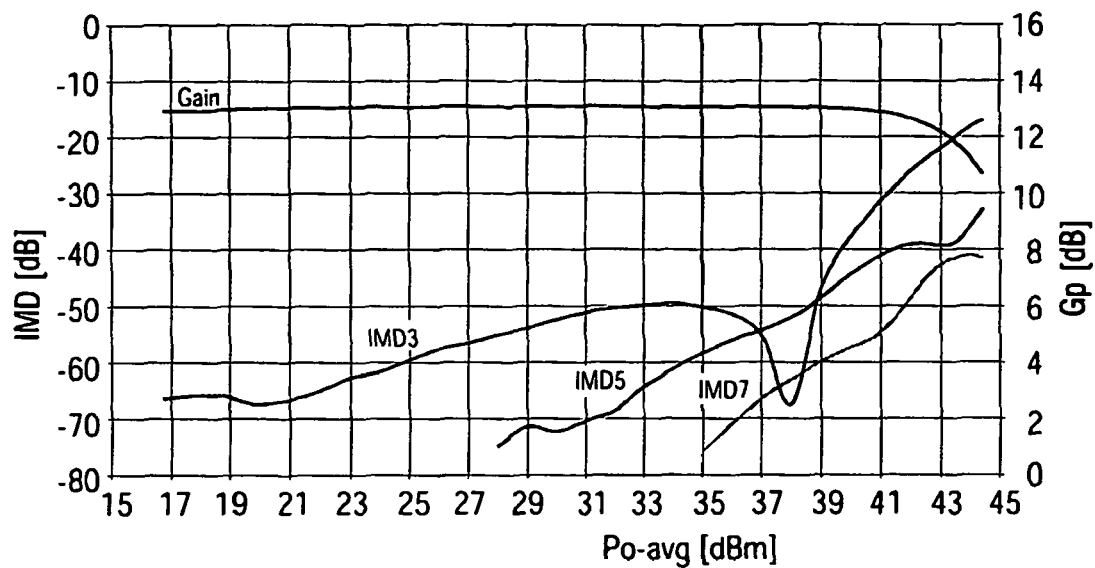
Figure 9:
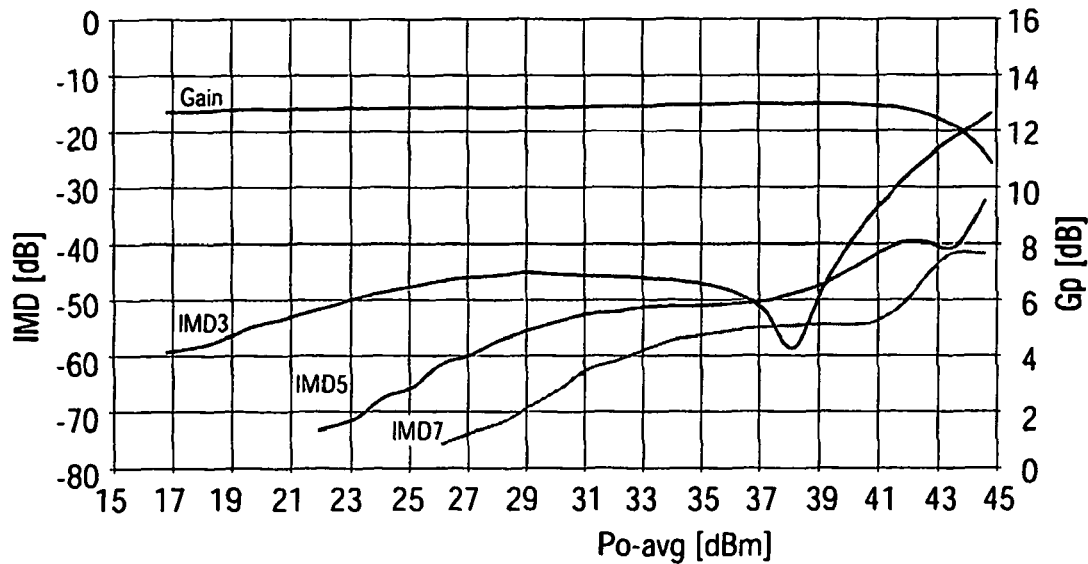

FIG. 8 shows the uneven order of the intermodulation IMD3, IMD5, IMD7 as a function of the average output voltage for the device according to the invention. FIG. 9 shows the same data for the prior art device. From the comparison it becomes apparent that the intermodulation distortion in the device according to the invention is significantly lower. Whereas the IMD3 level increases to more than −50 dB at 23 dBm already in the prior art device, the IMD3, the IMD5 as well as the IMD7 levels remain below −50 dB up to values of 39 dBm in the device according to the invention.

The invention claimed is:

1. An electronic device comprising a field effect transistor provided with a plurality of parallel-connected transistor segments having mutually different threshold voltages, characterized in that each of the transistor segments comprises a first region and a second region, the first region having a first threshold voltage and the second region having a second threshold voltage.

2. An electronic device as claimed in claim 1, characterized in that each of the transistor segments also comprises a third region having a third threshold voltage, which is lower than the second threshold voltage.

3. An electronic device as claimed in claim 1, characterized in that the difference between the first and the second threshold voltage amounts to 5-20% of the average threshold voltage.

4. An electronic device as claimed in claim 2, characterized in that the difference between the second and the third threshold voltage amounts to 5-20% of the average threshold voltage.

5. An electronic device as claimed in claim 3, characterized in that the difference in the threshold voltage amounts to 10-15% of the average threshold voltage.

6. An electronic device as claimed in claim 2, characterized in that the first region comprises 40-60% of the surface area of the segment.

7. An electronic device as claimed in claim 1, characterized in that the field effect transistor is a MOS transistor, which is defined in a semiconductor body comprising highly doped source and drain zones and a channel region extending between the source zone and the drain zone, with a gate electrode being present which overlaps the channel region upon perpendicular projection thereon, in which the source zone, the drain zone and the gate electrode are connected on the surface to a metal source contact, a drain contact and a gate electrode contact, respectively, in which the semiconductor body comprises a comparatively weakly doped region of a first conductivity type adjoining the surface, which region comprises the highly doped source and drain zone of the opposite, second conductivity type and a weakly doped drain extension between the drain zone and the channel region, in which the gate electrode is electrically insulated from the channel region and in which an electrically insulating layer is laid over the surface, which layer has contact windows above the source zone, the drain zone and the gate electrode, through which contact windows the source zone, the drain zone and the gate electrode, respectively, are connected to the contacts.

8. An electronic device as claimed in claim 7, characterized in that another metal strip is present between the gate electrode contact and the drain contact, which strip is electrically insulated from the semiconductor body and which is locally connected to the source strip via an electrical connection, and which form a screen between the gate electrode contact and the drain contact.

9. An electronic device as claimed in claim 1, characterized in that the field effect transistor is used as an amplifier and is assembled on a carrier provided with an impedance matching circuit that is connected to the output of the field effect transistor.

10. An electronic device as claimed in claim 1, characterized in that the field effect transistor can be operated as an class AB amplifier.

* * * * *